(12) United States Patent
Bae et al.

(10) Patent No.: US 6,979,583 B2
(45) Date of Patent: Dec. 27, 2005

(54) ELECTRO-LUMINESCENT DISPLAY AND A METHOD OF MANUFACTURING THE SAME

(75) Inventors: Sung-Joon Bae, Sungnam-shi (KR); Jae-Yong Park, Seoul (KR)

(73) Assignee: LG Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/431,515

(22) Filed: May 8, 2003

(65) Prior Publication Data
US 2003/0203527 A1     Oct. 30, 2003

Related U.S. Application Data

(62) Division of application No. 09/550,411, filed on Apr. 17, 2000, now Pat. No. 6,617,608.

(30) Foreign Application Priority Data
May 27, 1999  (KR) .............................. 1999-19286

(51) Int. Cl.$^7$ ............................................. H01L 21/00
(52) U.S. Cl. .......................... 438/34; 438/82; 438/99
(58) Field of Search ........................... 257/40, 59, 72, 257/79, 83, 99, 642, 759; 315/169.3; 345/76; 438/29, 34, 69, 82, 99, 623

(56) References Cited

U.S. PATENT DOCUMENTS

| | | | |
|---|---|---|---|
| 5,550,066 A | 8/1996 | Tang et al. | |
| 5,670,792 A | 9/1997 | Utsugi et al. | |
| 5,684,365 A | 11/1997 | Tang et al. | |
| 6,011,607 A * | 1/2000 | Yamazaki et al. | .......... 349/153 |
| 6,046,547 A | 4/2000 | Nishio et al. | |
| 6,175,345 B1 | 1/2001 | Kuribayashi et al. | |
| 6,194,837 B1 | 2/2001 | Ozawa | |
| 6,204,610 B1 | 3/2001 | Komiya | |
| 6,236,063 B1 | 5/2001 | Yamazaki et al. | |
| 6,246,179 B1 | 6/2001 | Yamada | |
| 6,255,705 B1 * | 7/2001 | Zhang et al. | ................ 257/412 |
| 6,277,678 B1 * | 8/2001 | Lee | ............................ 438/151 |
| 6,566,686 B2 * | 5/2003 | Kim | ............................ 257/59 |
| 6,627,486 B1 * | 9/2003 | Ohtani et al. | ................ 438/166 |

FOREIGN PATENT DOCUMENTS

JP            08227276          9/1996

* cited by examiner

*Primary Examiner*—Asok Kumar Sarkar
(74) *Attorney, Agent, or Firm*—Birch, Stewart, Kolasch & Birch, LLP

(57) ABSTRACT

An electro-luminescent display and a method of manufacturing thereof prevents the formation of a barrier interface between the anode electrode and the electro-luminescent layer by placing the electro-luminescent layer directly on the anode electrode so that there is no need to etch a subsidiary layer so that the electro-luminescent layer and the anode electrode have excellent electrical contact. The elimination of this etching step prevents damage to the anode electrode caused by collision of ions with the anode electrode during the etching process. Further, etch remainders or contaminant particles that exist in the etchant gas are prevented from accumulating on the anode electrode. Thus, the charge carriers of the anode are easily transported across the interface between the anode electrode and the electro-luminescent layer so as to greatly improve the expected life span, the brightness, and the efficiency of the electro-luminescent display.

20 Claims, 6 Drawing Sheets

ELECTRO-LUMINESCENT DISPLAY AND A METHOD OF MANUFACTURING THE SAME

This application is a divisional of application Ser. No. 09/550,411, filed on Apr. 17, 2000, now U.S. Pat. No. 6,617,608 the entire contents of which are hereby incorporated by reference and for which priority is claimed under 35 U.S.C. §120; and this application claims priority of Application No. 1999-19286 filed in KOREA on May 27, 1999 under 35 U.S.C. §119.

BACKGROUND OF THE INVENTION

1. Field of the Invention

The present invention relates to an electro-luminescent display (ELD) and a method of manufacturing thereof. More specifically, the present invention relates to an active ELD including an organic luminescent layer.

2. Discussion of the Related Art

An ELD is a luminescent device that emits light when electrons and holes that are injected into a luminescent layer recombine. The emission of light by the recombination of electrons and holes eliminates the need for a back-light in the ELD. Thus, it is easy to manufacture a very thin panel using an ELD. Further, the ELD has the added advantage of low power consumption. Additionally, an organic ELD, having a light-emitting layer with an organic electro-luminescent (EL) substance, is characterized by a low driving voltage, high light-emitting efficiency, and low process temperature. However, organic EL substances are vulnerable to moisture so that the patterns are defined by a method that prevents the organic EL substance from contacting moisture directly, unlike conventional photolithography.

In an active ELD, a plurality of pixel cells are defined by providing a plurality of scanning lines that cross with a plurality of signal lines, and also such that a power supply line is arranged in the same direction as the signal line in each of the pixel cells. Each pixel cell includes a storage capacitor, an EL portion, and at least one switching device such as a thin film transistor (TFT).

When the pixel cell includes two TFTs, an excitation signal for the EL portion is distinguished from the scanning signal. The EL portion is selected by a logic TFT which is the first TFT, and the excitation signal for the EL portion is controlled by the second TFT. The storage capacitor then maintains the excitation power in the EL portion of the selected cell.

FIG. 1A to FIG. 1D illustrate a method of manufacturing an ELD according to a related art method. Referring to FIG. 1A, polysilicon is deposited on an insulating substrate 11 having a switching part and a pixel part, via a chemical vapor deposition (CVD) process. Then an active layer 13 is formed by patterning the polysilicon via a photolithography process. An insulating substance such as silicon oxide, silicon nitride, or other similar substances are then deposited on the insulating substrate 11 to cover the active layer 13. Next, an electrically-conductive substance is deposited on the insulating substance. Then, a gate insulating layer 15 and a gate electrode 17 is formed by sequentially patterning the electrically-conductive substance and the insulating substance so that they remain on the middle portion of the active layer 13. Note that a scanning line (not shown in the drawing) that is connected to the gate electrode 17 may be provided as soon as the gate electrode 17 is formed. A source region 19 and a drain region 21 are then formed by heavily doping the exposed portions of the active layer 13 with either n type or p type impurities with the gate electrode 17 functioning as a mask. Note that the middle portion of the active layer 13, which is not doped with impurities, becomes a channel region.

Referring to FIG. 1B, a first insulating interlayer 23 is then provided and covers the active layer 13, the gate electrode 17, and the scanning line by depositing an insulating substance such as silicon oxide, silicon nitride, or other similar substances on the insulating substrate 11. Next, the first insulating interlayer 23 is patterned to expose the source region 19 and the drain region 21, and a source electrode 25 and a drain electrode 27 are connected electrically with the exposed source region 19 and exposed drain region 21, respectively, by depositing and then patterning a known conductive substance. Thus, a TFT that functions as a switching device is manufactured. Note that a signal line (not shown in the drawing) may be defined on the insulating interlayer 23 at the same time the source electrode 25 and the drain electrode 27 are provided.

Referring to FIG. 1C, a second insulating interlayer 29 is provided and covers the source electrode 25 and the drain electrode 27 and the signal line by depositing silicon oxide or silicon nitride on the first insulating interlayer 23. A contact hole 30 exposes the drain electrode 27 and is provided by patterning the second insulating interlayer 29. Next, a transparent conductive substance is deposited so as to contact the exposed portion of the drain electrode 27 through the contact hole 30 that is provided in the second insulating interlayer 29. Then, an anode electrode 31 is formed by patterning via a photolithography process the transparent conductive substance so that the anode electrode 31 remains in the pixel portion of the second insulating interlayer 29. Note that the anode electrode 31 is electrically connected to the drain electrode 27, and is isolated electrically from other anode electrodes in adjacent pixel cells.

Referring to FIG. 1D, a passivation layer 33 covers the anode electrode 31 by the deposition of silicon oxide or silicon nitride on the second insulating interlayer 29. Alternatively, the passivation layer 33 may be formed with an organic substance such as BCB (benzocyclobutene), SOG (spin-on glass), and other similar substances. Note that the passivation layer 33 made of an organic substance may be relatively thick in order to provide an even surface. Next, the passivation layer 33 is patterned via a photolithography process, including a dry etching process, so as to expose the anode electrode 31. An organic EL layer 35, which emits a predetermined color such as red, blue, or green, is provided on the passivation layer 33 by an evaporation process. Note that the organic EL layer 35 just contacts the anode electrode 31 and the exposed pixel portion. Next, a cathode electrode 37, which functions as a common electrode and is connected to ground, is disposed on the organic EL layer 35.

As mentioned in the above description, the ELD of the related art carries out the switching operation by selecting a TFT that has an n-type channel in a certain pixel, which has a predetermined signal line (not shown in the drawing) crossing with a predetermined scanning line (not shown in the drawing), such that a 'high' signal is applied to the predetermined scanning line while a 'high' signal is applied to the predetermined signal line. Thus, the selected TFT turns on and transfers the signal of the predetermined signal line to the drain electrode by which holes are injected into the organic EL layer via the anode electrode and electrons are injected into the organic EL layer via the grounded cathode electrode. Thus, the pixel cell achieves light-emission through the recombination of electrons and holes.

Unfortunately, in the structure and method of the related art, the exposed portion of the anode electrode is easily damaged by the collision of the ions when dry-etching the passivation layer for exposing the anode electrode. Further, contaminant particles, albeit a small amount, remain on the exposed portion of the anode electrode after the etching process. Thus, the damage to the anode electrode caused by the collision of the ions during the etching process and the remaining contaminant particles on the anode electrode after the etching process creates a barrier interface between the anode electrode and the EL layer that hinders the efficient transport of charge carriers such as holes. Therefore, the expected life span, brightness, and efficiency of the ELD suffers greatly from the structure and method of the related art.

SUMMARY OF THE INVENTION

To overcome the problems described above, preferred embodiments of the present invention provide an ELD and a method of manufacturing the ELD that improves the expected life span, brightness, and efficiency of the ELD by preventing the generation of a barrier interface between the anode electrode and the organic EL layer, which hinders the transport of charge carriers such as holes across the interface.

A preferred embodiment of the present invention includes a substrate having a pixel portion and a switching portion, an active layer on the switching portion of the substrate including a source region on a first side end of the active layer, a drain region on a second end of the active layer, and a channel region at a middle portion of the active layer and in between the drain region and the source region, a gate insulating layer on the channel region, a gate electrode on the gate insulating layer such that the gate insulating layer is disposed between the gate electrode and the active layer, an insulating interlayer on the substrate including the gate electrode, wherein the insulating interlayer does not substantially cover the source and drain regions so that substantial portions of the source and drain regions are exposed, a source electrode and a drain electrode in contact electrically with the exposed portions of the source and drain regions, respectively, a passivation layer on the insulating interlayer, wherein the passivation layer covers the source electrode and the drain electrode, a connect hole in the passivation layer, wherein the connect hole substantially exposes the drain electrode, an anode electrode on the passivation layer, wherein the anode electrode is in contact electrically with the drain electrode through the connect hole, an organic electro-luminescent layer on the passivation layer and covering the anode electrode, and a cathode electrode on the organic electro-luminescent layer.

Another preferred embodiment of the present invention includes a substrate, a plurality of layers on the substrate, wherein the plurality of layers includes source and drain electrodes, a passivation layer on the substrate and covering the source and drain electrodes, a connect hole in the passivation layer and exposing the drain electrode, an anode electrode on the passivation layer and in contact with the drain electrode, and an organic electro-luminescent layer on the passivation layer covering the anode electrode.

In another preferred embodiment of the present invention, a method of manufacturing an ELD includes the steps of providing a substrate, separating the substrate into a switching portion and a pixel portion, forming an active layer on the switching portion, forming a gate insulating layer and a gate electrode on a middle portion of the active layer, forming a source region and a drain region on exposed portions of the active layer by doping the exposed portions of the active layer heavily with impurities while using the gate electrode as a mask, disposing an insulating interlayer on the substrate and covering the active layer and the gate electrode, patterning the insulating interlayer so as to expose the source and drain regions, forming a source electrode and a drain electrode that is in contact with the exposed portions of the source and drain regions, forming a passivation layer on the insulating interlayer, defining a contact hole in the passivation layer for exposing the drain electrode, defining an anode electrode on the passivation layer, and covering the drain electrode so as to be in contact with the drain electrode, forming an organic electro-luminescent layer on the passivation layer and covering the anode electrode, defining a cathode electrode on the organic electro-luminescent layer.

Therefore, preferred embodiments of the present invention provide an ELD structure and method of manufacturing an ELD which achieve the advantages of increasing the expected lifespan, increasing the brightness, and improving the efficiency of the ELD by preventing the generation of a barrier interface between the anode electrode and a electro-luminescence layer by eliminating a subsidiary layer between the anode electrode and the electro-luminescence layer thereby removing the need to etch the subsidiary layer for allowing the anode electrode and the electro-luminescence layer to have excellent contact therebetween.

Other features, elements and advantages of the present invention will be described in detail below with reference to preferred embodiments of the present invention and the attached drawings.

BRIEF DESCRIPTION OF THE ATTACHED DRAWINGS

The present invention will become more fully understood from the detailed description given herein below and the accompanying drawings which are given by way of illustration only, and thus do not limit the present invention and wherein.

DETAILED DESCRIPTION OF PREFERRED EMBODIMENTS

Figure 1A:
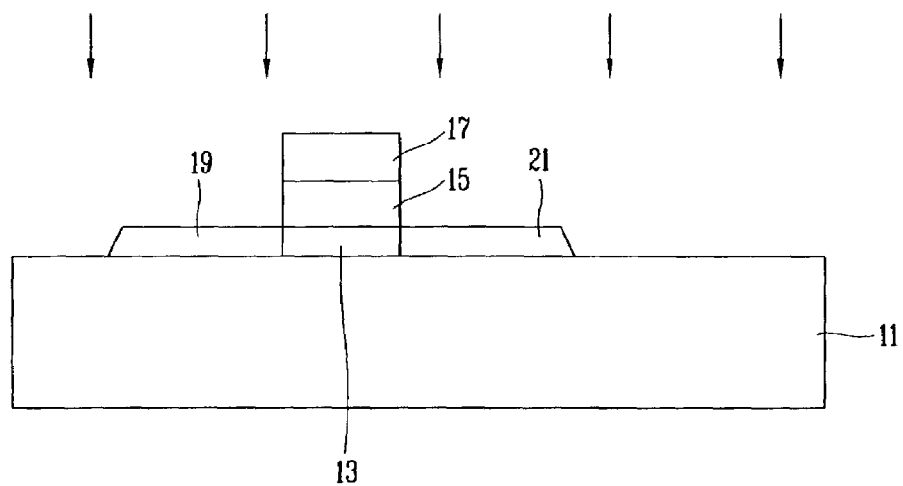
FIG. 1A to FIG. 1D illustrate a method of manufacturing an ELD according to a related art.
Figure 1B:
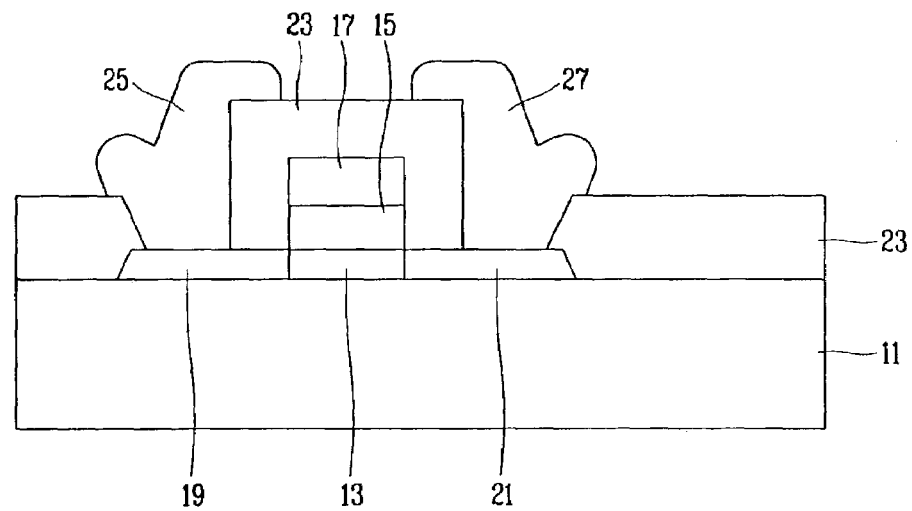
Figure 1C:
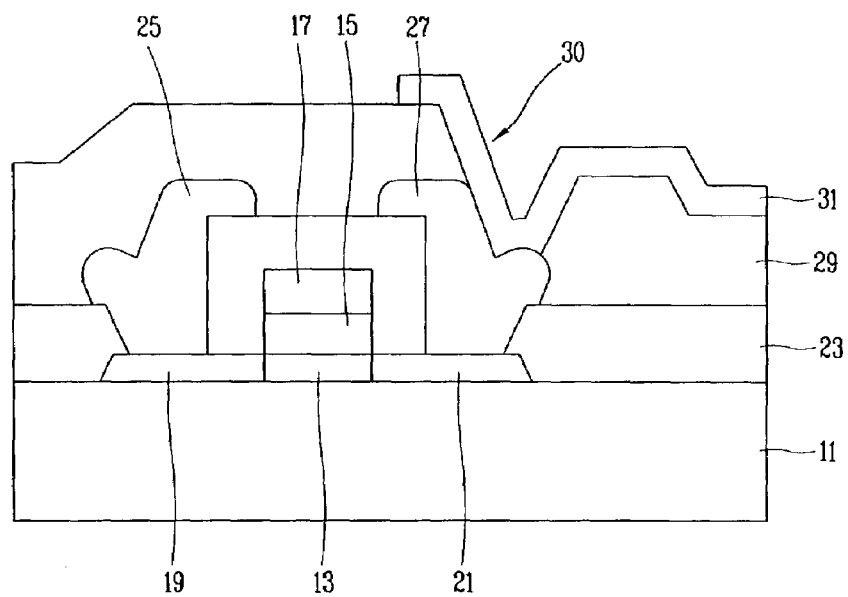
Figure 1D:
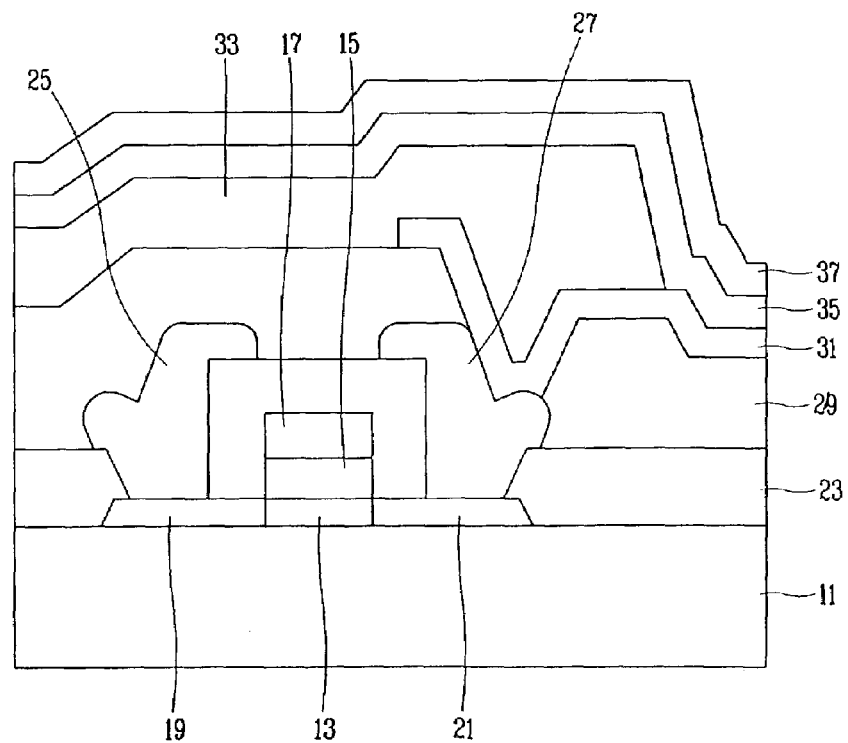
Figure 2A:
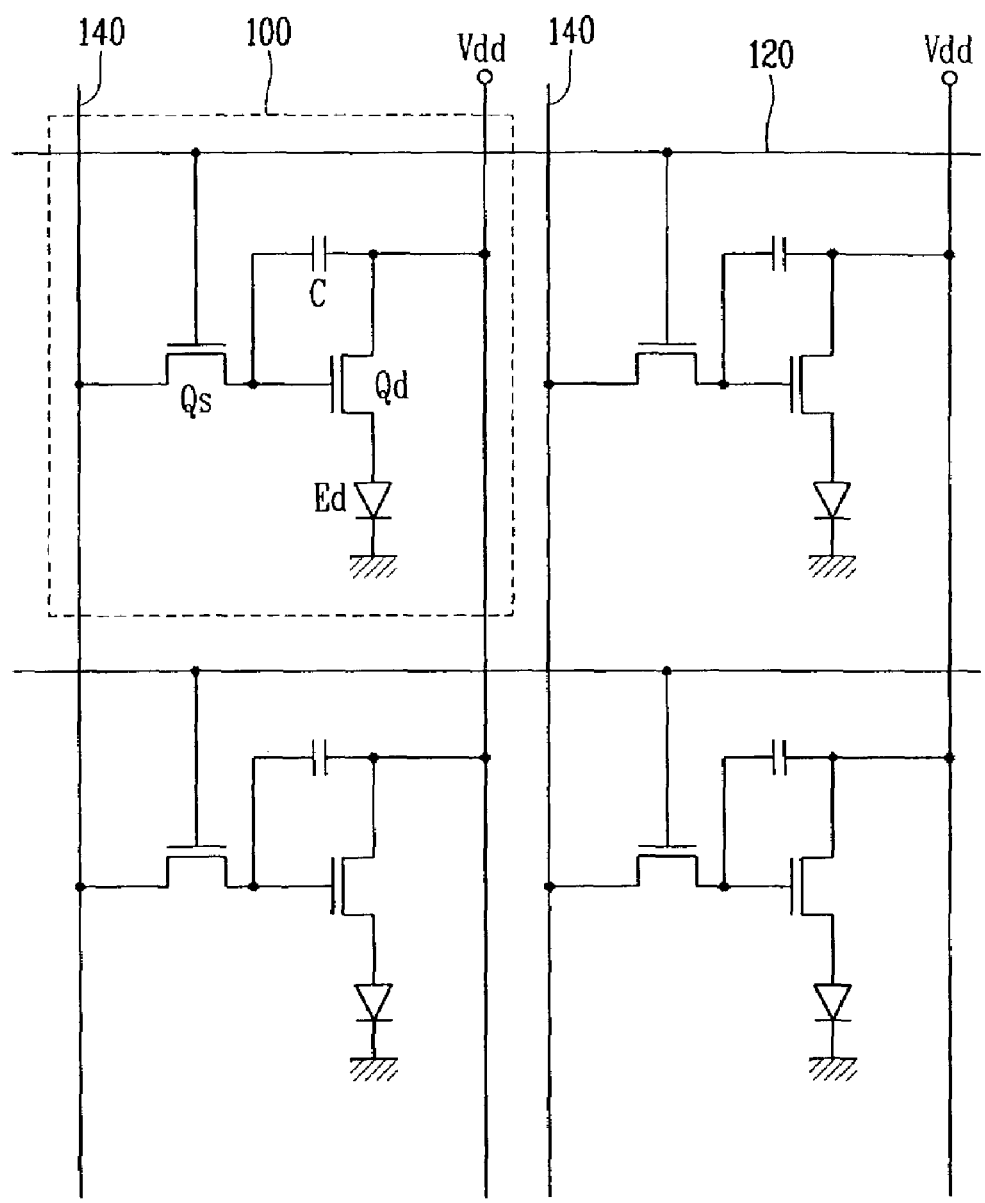
FIG. 2A is a general diagram of an ELD according to a preferred embodiment of the invention.
Figure 2B:
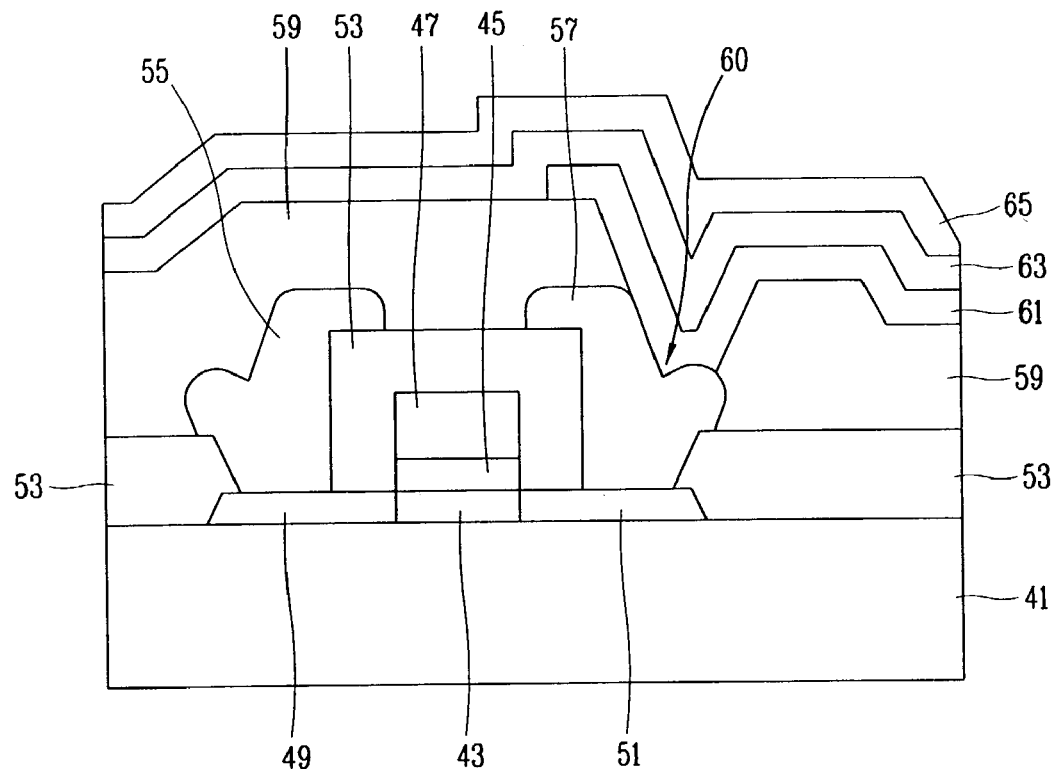
FIG. 2B is a cross-sectional view of a portion of an ELD according to a preferred embodiment of the present invention.

FIG. 2A is a general diagram of an ELD and FIG. 2B is a cross-sectional view of an ELD according to a preferred embodiment of the present invention. As shown in FIG. 2A, the ELD includes a plurality of pixels each pixel 100 including: a switching TFT (Qs) having a gate electrode connected to a gate line 120 and a source electrode connected to a data line 140; a driving TFT (Qd) having a gate electrode connected to a drain of the switching TFT, a source electrode connected to a power line Vdd, and a drain electrode connected to an electro-luminescent diode Ed; and a capacitor C connected between the gate electrode and the source electrode of the driving TFT.

Referring to FIG. 2B, each pixel of the ELD according to the present invention includes an active layer 43 preferably made of polysilicon and preferably having a thickness of about 500 Å to about 1000 Å disposed on a predetermined portion of a switching portion of an insulating substrate 41 made of a transparent substance such as quartz, glass, or other similar substance, and having a switching portion and a pixel portion. A source region 49 and a drain region 51, which are doped heavily with either n-type impurities such as P or, As, or p-type impurities such as B, are provided at both ends of the active layer 43. The approximate central portion of the active layer 43 is not doped with impurities and defines a channel region. A gate insulating layer 45, which is preferably made of an insulating substance such as silicon oxide, silicon nitride and other similar substances and preferably about 800 Å to 1500 Å thick, is provided on the channel region of the active layer 43. A gate electrode 47, which is made of an electrically-conductive substance such as Al, Al alloy or other similar substances having a low resistance and preferably about 4000 Å to 5000 Å thick, is provided on the gate insulating layer 45.

In the present preferred embodiment, the gate electrode 47 may have two layers such that a refractory metal such as Cr, Mo, Ti, Ta, or other similar metals are deposited on a low resistance metal such as Al, Al alloy or other similar metals. Also, the gate electrode 47 may be formed as soon as a scanning line (not shown in the drawing), which is connected to the gate electrode 47, is provided.

Next, an insulating interlayer 53 that exposes the source region 49 and the drain region 51 are defined on the insulating substrate 41 and covers the gate electrode 47. The insulating interlayer 53 is preferably about 4000 Å to 5000 Å thick is defined preferably by depositing an insulator such as silicon oxide, silicon nitride and other similar substances. Then, a source electrode 55 and a drain electrode 57, which are preferably in contact electrically with the exposed portions of the source region 49 and the drain regions 51, respectively, are provided on the insulating interlayer 53. The source electrode 55 and the drain electrode 57 are preferably made of a single layer of conductive metal such as Al, Al alloy, or other similar substances having a low resistance. Note that a signal line (not shown in the drawing) that is connected to the source electrode 55 may be formed on the insulating interlayer 53 at the same time that the source electrode 55 is formed. A passivation layer 59 that covers the source electrode 55 and the signal line, but which exposes the drain electrode 57 through a hole 60, is provided on the insulating interlayer 53. The passivation layer 59 is provided preferably by depositing silicon oxide or silicon nitride and having a thickness preferably about 4000 Å to about 5000 Å, and then coating the deposited silicon oxide or silicon nitride with an organic substance such as BCB (Benzocyclobutene), SOG(Spin On Glass), or other similar substances, wherein the coating is preferably about 1 $\mu$m to about 3 $\mu$m thick. Note that in preferred embodiments of the present invention, the degradation from steps in the layers is less since the passivation layer 59 is relatively thick and includes the organic substance to provide a smooth surface thereon.

Next, an anode electrode 61 that is in contact electrically with the exposed portion of the drain electrode 57 through the hole 60 is provided on the passivation layer 59 of the pixel portion. Note that the anode electrode 61, which is defined preferably by depositing a transparent conductive substance such as an ITO (Indium Tin Oxide), TO(Tin Oxide), or other similar substances and is preferably about 1000 to 2000 Å thick, is isolated electrically from the other anode electrodes in the neighboring pixel cells. An organic EL layer 63 is then provided on the passivation layer 59 and preferably covers the anode electrode 61. Note that the organic EL layer 63 is preferably about 1000 to 2000 Å thick, and is defined by preferably depositing a substance that emits a light having a red, blue, or green color as electrons and holes recombine. Then, a cathode electrode 65, which is preferably used as a common electrode connected to ground, is defined on the organic EL layer 63. The cathode electrode 65 is defined preferably by depositing a metal having a low work function, such as Al, Al alloy, Ka, Na, Ca, Li, or other similar substances, to make it easy for electrons to be injected into the organic EL layer 63, and is preferably about 1000 Å to about 3000 Å thick. Note that the organic EL layer 63 also includes a hole injecting and transporting region that is in contact with the anode electrode 61, and an electron injecting and transporting region that is in contact with the cathode electrode 65, and a luminescent layer that emits light. The hole or electron injecting/transporting regions may be provided with a single substance or with multiple substances. The light emission occurs in the hole and electron injecting/transporting region as the transported electrons and holes recombine in the luminescent layer.

Note that in preferred embodiments of the present invention, the organic EL layer 63 is defined on the entire anode electrode 61 and is in contact with the entire anode electrode without a subsidiary layer (e.g., layer 33 in FIG. 1) located in between. Therefore, the surface of the anode electrode 61 is not damaged since an etching process is not necessary for the organic EL layer 63 to contact the anode electrode 61. Further, the etch remainders or the contaminant particles that are contained in etchant do not exist on the anode electrode 61.

Therefore, the expected life span, brightness, and efficiency of the ELD is improved dramatically as charge carriers such as holes are transported with ease at the interface between the anode electrode 61 and the organic EL layer 63.

Figure 3A:
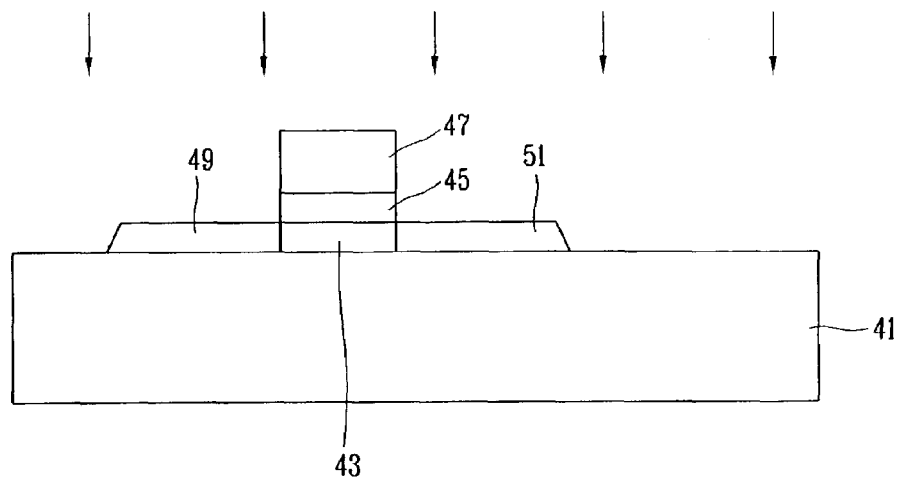
FIG. 3A to FIG. 3D illustrate a method of manufacturing an ELD according to another preferred embodiment of the present invention.

FIG. 3A to FIG. 3D illustrate a method of manufacturing an ELD having the configuration as shown in FIG. 2 according to a preferred embodiment of the present invention. Referring to FIG. 3A, an active layer 43 is provided preferably by depositing a polysilicon layer preferably having a thickness of about 500 Å to about 1000 Å on an insulating substrate 41 having a switching portion and a pixel portion preferably via a CVD process and then patterning the polysilicon layer preferably via a photolithography process. The insulating substrate 41 is preferably made of a transparent substance such as quartz, glass, or other similar substances. An insulating substance, preferably having a thickness of about 800 Å to about 1500 Å, such as silicon oxide, silicon nitride, and other similar substances is deposited on the insulating substrate 41 preferably via a CVD process and preferably covers the active layer 43. Next, a conductive metal preferably having a thickness of about 4000 Å to about 5000 Å, and preferably having low resistivity, such as Al, Al alloy, or other similar metals is deposited on the insulating substance preferably via a sputtering method. Next, a gate electrode 47 and a gate insulating layer 45 are then provided by patterning, preferably via a photolithography process, the conductive metal and the insulating substance so that they remain on a portion (e.g., middle portion) of the active layer 43. In the above-described method, the gate electrode 47 may preferably have two layers such that a refractory metal, which is made of Cr, Mo, Ti, Ta, or other similar substances, is disposed preferably on a low resistance metal such as Al, Al alloy or other similar substances. Note that the gate electrode 47 may be provided as soon as a scanning line (not shown in the drawing) that is connected to the gate electrode 47 is formed.

A source region 49 and a drain region 51, both of which are preferably doped heavily with either n-type impurities such as P, As, or p-type impurities such as B, are defined preferably at the two exposed ends of the active layer 43. The middle portion of the active layer 43, which is not doped with impurities, defines a channel region of the active layer 43.

Figure 3B:
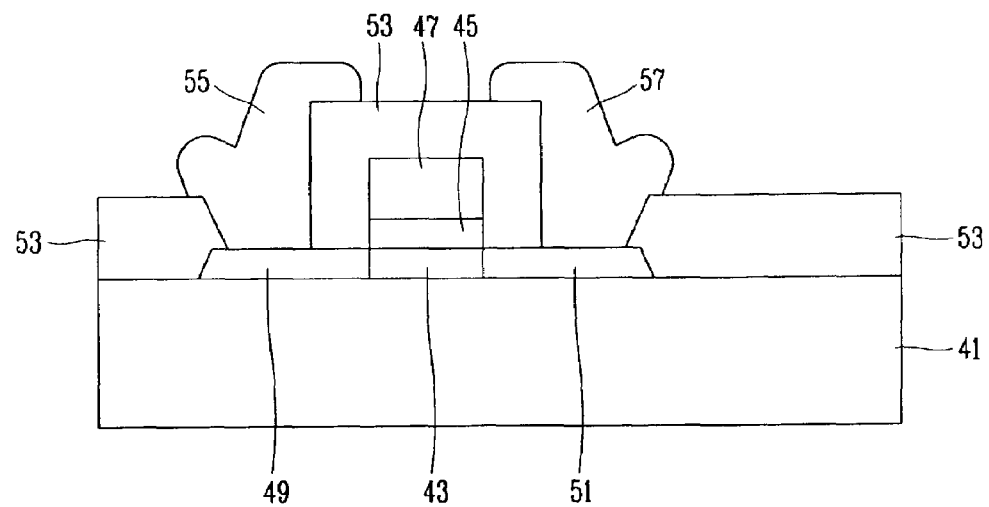

Referring to FIG. 3B, an insulating interlayer 53 is provided on the insulating substrate 41 and preferably covers the gate electrode 47, the active layer 43, and the scanning line by dispersing an insulating substance preferably having a thickness of about 4000 Å to about 5000 Å such as silicon oxide, silicon nitride and other similar substances. The insulating interlayer 53 is then preferably patterned so as to expose the source region 49 and the drain region 51. Next, a source electrode 55 and a drain electrode 57, which are in contact electrically with the exposed portions of the source region 49 and the drain region 51, respectively, are defined on the insulating interlayer 53. The source electrode 55 and the drain electrode 57 are formed preferably by depositing and then patterning the conductive metal having a low resistance such as Al, Al alloy, or other similar substances preferably via a sputtering method and then preferably via a photolithography process, respectively. The resultant structure is a thin film transistor that functions as a switching device. Note that the source electrode 55 and the drain electrode 57 are preferably made from a single layer of a conductive metal such as Al, Al alloy, or other similar substances having a low resistance. Also, a signal line (not shown in the drawing) is connected to the source electrode 55, and may be defined on the insulating interlayer 53 at the same time as the source electrode 55 and the drain electrode 57 are formed.

Figure 3C:
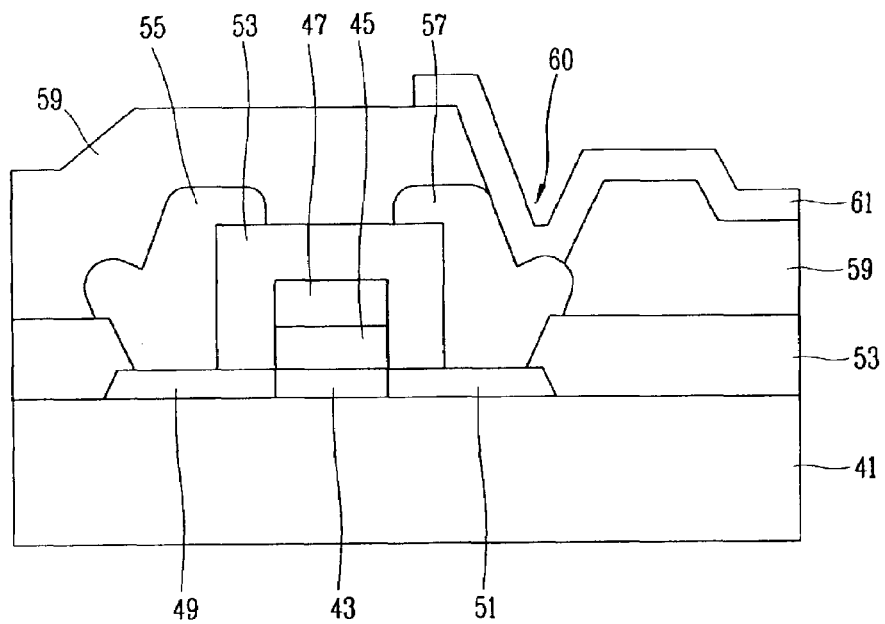

Referring to FIG. 3C, a passivation layer 59 preferably having a thickness of about 4000 Å to about 5000 Å is provided preferably by depositing silicon oxide or silicon nitride to cover the source electrode 55 and the drain electrode 57 and the signal line preferably via a CVD process. Then a surface of the deposited silicon oxide or silicon nitride is preferably coated the with a substance such as BCB (BenzoCycloButene), SOG (Spin On Glass), or other similar substances to a thickness of preferably about 1 μm to about 3 μm. Note that the passivation layer 59 is preferably made relatively thick so that degradation due to steps in the succeeding layers is eliminated since the passivation layer 59 is provided with a smooth surface by the organic substance coated thereon. Next, a hole 60 for exposing the drain electrode 57 is provided by patterning the passivation layer 59 preferably via a photolithography process including a dry etch step. An anode electrode 61 is then provided on the passivation layer 59 of the pixel portion, and is preferably in contact electrically with the exposed portion of the drain electrode 57 through the hole 60. The anode electrode 61, which is provided preferably by depositing a transparent conductive substance such as ITO (Indium Tin Oxide), TO (Tin Oxide), or other similar substances at a thickness of preferably about 1000 Å to about 2000 Å, is preferably isolated electrically from the other anode electrodes in the adjacent pixels.

Figure 3D:
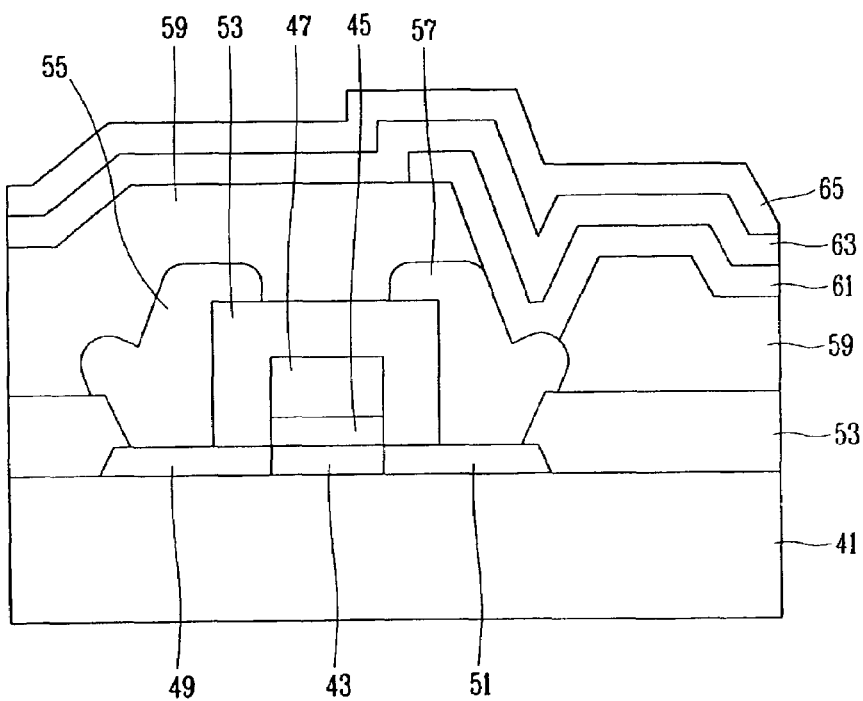

Referring to FIG. 3D, an organic EL layer 63 is provided and covers and directly contacts the anode electrode 61. Next, a cathode electrode 65, which functions as a common electrode, is provided on the organic EL layer 63. The cathode electrode 65 is preferably about 1000 Å to about 3000 Å thick, and is provided by depositing a metal with a low work function such as Al, Al alloy, Ka, Na, Ca, Li, or other similar metals for easier injection of electrons into the organic EL layer 63. The organic EL layer 63 is preferably about 1000 Å to about 2000 Å thick, and is provided preferably by depositing a substance that emits light as electrons and holes recombine, the light being either red, blue, or green. The organic EL layer 63 preferably includes a hole injecting and transporting region that is in contact with the anode electrode 61, an electron injecting and transporting region that is in contact with the cathode electrode 65, and a luminescent layer that emits light. Note that the hole and electron injecting/transporting regions may be defined with a single substance or with multiple substances. Light-emission occurs in the hole and electron injecting/transporting regions as the transported electrons and holes recombine in the luminescent layer.

Note that in the ELD of preferred embodiments of the present invention, the organic EL layer 63 is provided on the anode electrode 61 and in contact with the entire anode electrode without a subsidiary layer disposed in between. Thus, the surface of the anode electrode 61 is not damaged because an etching step is not performed to allow the organic EL layer 63 to be in contact with the anode electrode 61. Further, etch remainders or contaminant particles contained in the etch gases do not accumulate on the surface of the anode electrode 61. Accordingly, there does not exist a barrier interface between the anode electrode and organic EL layer which would hinder the transport of carriers such as holes. Therefore, the expected life span, the brightness, and the efficiency of the ELD are greatly improved as the holes are transported through the interface between the anode electrode and organic EL layer with ease.

While the invention has been particularly shown and described with reference to preferred embodiments thereof, it will be understood by those skilled in the art that the foregoing and other changes in form and details may be made therein without departing from the spirit and scope of the present invention.

What is claimed is:

1. A method of manufacturing an active electro-luminescent display, the method comprising the steps of:
   providing a substrate having a switching portion and a pixel portion;
   forming an active layer on the pixel portion;
   forming a gate insulating layer and a metal gate electrode on an approximate middle portion of the active layer;
   forming a source region and a drain region on exposed portions of the active layer by doping the exposed portions of the active layer heavily with impurities while using the metal gate electrode as a mask;
   disposing an insulating interlayer on the substrate and covering the active layer and the metal gate electrode;
   patterning the insulating interlayer so as to expose the source and drain regions;
   forming a source electrode and a drain electrode that is in contact with the exposed portions of the source and drain regions;
   forming a passivation layer on the insulating interlayer;
   forming a contact hole in the passivation layer for exposing the drain electrode;
   forming an anode electrode on the passivation layer, and covering the drain electrode so as to be in contact with the drain electrode;
   forming an organic electro-luminescent layer on the passivation layer and covering the entire anode electrode; and
   defining a cathode electrode on the organic electro-luminescent layer;

wherein the anode electrode and cathode electrode being contacted with the organic electro-luminescent layer to supply electrons and holes into the organic electrode-luminescent layer.

2. The method of claim 1, wherein the step of forming the active layer includes depositing a polysilicon layer.

3. The method of claim 1, wherein the step of forming the passivation layer includes depositing an inorganic substance including silicon oxide or silicon nitride.

4. The method of claim 1, wherein the step of forming the passivation layer includes coating an organic substance including one of benzocyclobutene or Spin on Glass to a thickness of about 1 $\mu$m to about 3 $\mu$m.

5. The method of claim 1, wherein the step of forming the organic electro-luminescent layer includes:
   forming a hole injecting/transporting region in the electro-luminescent layer and in contact with the anode electrode,
   forming an electron injecting/transporting region in the electro-luminescent layer and in contact with the cathode electrode, and
   forming a luminescent layer for emitting light when electrons and holes are recombined in the luminescent layer.

6. The method of claim 1, wherein the active layer is about 500 Å to 1000 Å thick.

7. The method of claim 1, wherein the gate insulating layer is formed from silicon oxide or silicon nitride.

8. The method of claim 1, wherein the gate insulating layer is about 800 Å to 1500 Å thick.

9. The method of claim 1, wherein the metal gate electrode has two layers comprising:
   a refractory metal layer formed from Cr, Mo, Ti or Ta, and
   a low resistance metal layer formed from Al or Al alloy.

10. The method of claim 1, wherein the insulating interlayer is formed from silicon oxide or silicon nitride.

11. The method of claim 1, wherein the insulating interlayer is about 4000 Å to 5000 Å thick.

12. The method of claim 1, wherein the passivation layer is about 4000 Å to 5000 Å thick.

13. The method of claim 1, wherein the organic electro-luminescent layer is about 1000 Å to 2000 Å thick.

14. The method of claim 1, wherein the cathode electrode is formed from a metal having a low work function selected from Al, Al alloy, Ka, Na, Ca or Li.

15. The method of claim 1, wherein the cathode electrode is about 1000 Å to 3000 Å thick.

16. The method of claim 1, wherein the organic electro-luminescent layer is defined on the entire anode electrode.

17. The method of claim 1, wherein the organic electro-luminescent layer is in contact with the entire anode electrode without a subsidiary layer located in between.

18. The method of claim 1, wherein the metal gate electrode has a thickness of 4,000–5,000 Å and has at least one layer of Al or Al alloy.

19. The method of claim 1, wherein the step of forming the passivation layer on the insulating interlayer includes depositing an inorganic substance on the insulating interlayer and coating an organic substance on the inorganic substance, and wherein the step of forming the anode electrode on the passivation layer includes forming the anode electrode on the passivation layer so as to be in contact with the inorganic substance.

20. A method of manufacturing an active electro-luminescent display, the method comprising the steps of:
   providing a substrate having a switching portion and a pixel portion;
   forming an active layer on the pixel portion;
   forming a gate insulating layer and a metal gate electrode on an approximate middle portion of the active layer;
   forming a source region and a drain region on exposed portions of the active layer by doping the exposed portions of the active layer heavily with impurities while using the metal gate electrode as a mask;
   disposing an insulating interlayer on the substrate and covering the active layer and the metal gate electrode;
   patterning the insulating interlayer so as to expose the source and drain regions;
   forming a source electrode and a drain electrode that is in contact with the exposed portions of the source and drain regions;
   forming a passivation layer on the insulating interlayer by depositing an inorganic substance on the insulating interlayer and coating an organic substance on the inorganic substance;
   forming a contact hole in the passivation layer for exposing the drain electrode;
   forming an anode electrode on the passivation layer so as to be in contact with the inorganic substance, and covering the entire drain electrode so as to be in contact with the drain electrode;
   forming an organic electro-luminescent layer on the passivation layer and covering the anode electrode; and
   defining a cathode electrode on the organic electro-luminescent layer.

\* \* \* \* \*